United States Patent
Nakamura

(10) Patent No.: US 7,239,218 B2
(45) Date of Patent: Jul. 3, 2007

(54) PHASE SHIFTER HAVING SWITCHABLE HIGH PASS FILTER AND LOW PASS FILTER PATHS AND IMPEDANCE ADJUSTMENT CIRCUITS

(75) Inventor: Junichi Nakamura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 26 days.

(21) Appl. No.: 11/169,723

(22) Filed: Jun. 30, 2005

(65) Prior Publication Data
US 2006/0001507 A1    Jan. 5, 2006

(30) Foreign Application Priority Data
Jun. 30, 2004   (JP) .............................. 2004-193117

(51) Int. Cl.
*H01P 1/18* (2006.01)
(52) U.S. Cl. ...................................... 333/139; 333/164
(58) Field of Classification Search ................ 333/139, 333/164
See application file for complete search history.

(56) References Cited
U.S. PATENT DOCUMENTS 4,612,520 A * 9/1986 Boire et al. .................. 333/156
4,733,203 A * 3/1988 Ayasli ......................... 333/139
5,039,873 A * 8/1991 Sasaki ......................... 327/237
5,519,349 A * 5/1996 Nakahara ..................... 327/237

FOREIGN PATENT DOCUMENTS

| JP | 11330802    | 11/1999 |
| JP | 2002-076810 | 3/2002  |

* cited by examiner

*Primary Examiner*—Benny Lee
(74) *Attorney, Agent, or Firm*—Young & Thompson

(57) ABSTRACT

A phase shifter with a low insertion loss in which impedance mismatch at a point in rear of a high-pass filter or a low-pass filter in the signal flow direction is reduced and difference in insertion loss or phase shifting error across a high-pass filter-low-pass filter is suppressed. A single pole double throw switch, provided on the input side, and another single pole double throw switch, provided on the output side and operatively linked to the single pole double throw switch, are changed over between a low-pass filter and a high-pass filter. An impedance adjustment circuit, provided between an input terminal and the single pole double throw switch, is made up by a capacitor, connected across the input terminal and a single pole side junction of the single pole double throw switch, and an inductor connected across the input terminal and ground.

16 Claims, 5 Drawing Sheets

PHASE SHIFTER HAVING SWITCHABLE HIGH PASS FILTER AND LOW PASS FILTER PATHS AND IMPEDANCE ADJUSTMENT CIRCUITS

FIELD OF THE INVENTION

This invention relates to a phase shifter and, more particularly, to a filter switching type phase shifter for use in the integrated circuits, generally.

BACKGROUND OF THE INVENTION

The filter switching type phase shifter is usually made up by a high-pass filter (HPF) for producing the phase lead of the signal phase, a lowpass filter (LPF) for producing the phase lag of the signal phase and single pole double throw switches (SPDT switches) for switching between the high-pass and low-pass filters. The quantity of phase shift is created by the phase difference produced on switching between these two filters.

The configuration of this filter switching type phase shifter will now be explained. FIG. 4 depicts a circuit diagram of a state-of-the-art filter switching type phase shifter. A high-pass filter (HPF) 102 is made up by two capacitors C101, C102, connected in series with a signal line, and an inductor L101, connected from a junction of the two capacitors C101, C102 to the ground. A low-pass filter (LPF) 103 is made up by two inductors L102, L103, connected in series with a signal line, and a capacitor C103, connected from the junction of the two inductors L102, L103 to the ground. The high-pass filter 102 and the low-pass filter 103 are connected via a single pole double throw switch (SPDTSW) 101a to an input terminal IN, while being connected via a single pole double throw switch (SPDTSW) 101b to an output terminal OUT.

The operation of the phase shifter, constructed as described above, will now be explained. If, when a signal from the input terminal IN to the output terminal OUT is passed through the high-pass filter 102, a bias, not shown, operating for turning an FET (field effect transistor) Q101 on, is applied to the gates of FETs (field effect transistors) Q101 and Q103, the source-drain resistance is lowered to establish a practically short-circuited state, and hence the current is allowed to pass through the high-pass filter 102. At this time, a bias, not shown, turning FETs Q102 and Q104 off, is applied across the gates of FETs Q102 and Q104, so that the resistance across the sources and the drains of the FETs Q102 and Q104 is increased, such that, from the signal line, the FETs Q102 and Q104 appear to be open-circuited, there being no current flowing through these FETs.

On the other hand, a bias voltage, not shown, which turns off the FET, is applied to the gates of the FET Q105 and the FET Q107, in order to inhibit the current flowing to the low-pass filter, thereby increasing the source-drain resistance of the FET Q105 and FET Q107. Moreover, a bias voltage, not shown, which turns on the FET, is applied to the gates of the FET Q106 and the FET Q108, thereby decreasing the source-drain resistance of the FET Q106 and FET Q108 to ground the weak current passed through the FETs Q105, Q107.

On the other hand, when the low-pass filter 103 is turned on, the signal is allowed to flow to the low-pass filter 103 by applying the bias which is the reverse of that described above to the gates of the FETs of the single pole double throw switches 101a, 101b.

In this manner, the single pole double throw switches 101a, 101b are changed over so that signals will flow through the high-pass filter 102 or the low-pass filter 103. The input signal will lag by the inductors L102, L103, connected in series with the low-pass filter 103, when the signal is passed through the low-pass filter 103, while the input signal will lead by the capacitors C101, C102, connected in series with the high-pass filter 102. Hence, the phase difference of the input signal is produced by changing over the filter units by the single pole double throw switches 101a, 101b. It is noted that, for realizing a desired phase shift value, the values of the components in the respective filter units need to be changed to optimum values.

Meanwhile, with the high frequency band, such as the GHz band, the effect of parasitic components of the FETs of the single pole double throw switches are demonstrated, such that the input/output impedance of the phase shifter becomes different at the time of switching between the high-pass filter 102 and the low-pass filter 103. The result is that signal insertion loss difference or the impedance mismatch between the load impedance and the filter units is produced to cause variations in the phase shift value. In order to combat this problem, the technique of reducing the effect of parasitic components of the single pole double throw switch is disclosed in Patent Document 1.

The phase shifter, disclosed in Patent Document 1, includes a resistance matching circuit in the input and output sides of switching means. This resistance matching circuit is made up of a matching inductor, connected in series with a signal transmission channel for canceling out the reflection ascribable to capacitance, at the time of turning off of the field effect transistor, and a matching resistor connected in parallel with the signal transmission channel for canceling out the reflection ascribable to parasitic resistance at the time of turning on of the field effect transistor.

As a relevant technique, Patent Document 2 discloses subjecting the high frequency signal entered to an input/output terminal to impedance changing by a matching stub.

[Patent Document 1]
  JP Patent Kokai Publication No. JP-P2002-76810A (FIG. 4)

[Patent Document 2]
  JP Patent Kokai Publication No. JP-A-11-330802 (FIG. 1)

SUMMARY OF THE INVENTION

In the phase shifter of FIG. 4, the impedance value after passage of the current through the high-pass filter differs from that after passage through the low-pass filter, under the effect of the parasitic component of the on-state FET and under the effect of the off-state FET, in spite of the same characteristic impedance at the input side, when the current passes through the switch unit. This state will now be explained by referring to FIGS. 5A and 5B.

FIGS. 5A and 5B depicts a Smith chart showing changes in impedance at the time of current passage through the respective filter elements of the 90° phase shifter. The components of the high-pass filter 102 and the low-pass filter 103 are set to values which will give 45° phase lead and 45° phase lag, respectively. Referring to FIG. 5A, in case the low-pass filter 103 is turned on, the impedance when looking at the input side after current passage through the respective components is such that, when the current passes through the switch unit on the lowpass filter side, through the inductor L102 on the input side of the low-pass filter, through the capacitor C103, connected in parallel with the inductor, and through the output side inductor L103, the impedance value is changed to positions of Z101, Z102, Z103 and Z104, respectively, whose corresponding locations in the circuit are shown in FIG. 4.

On the other hand, in case the high-pass filter 102 is turned on, the impedance is such that, when the current passes through the switch unit on the high-pass filter side, through the capacitor C101 on the input side of the highpass filter, through the inductor L101, connected in parallel with the capacitor, and through the output side capacitor C102, the impedance value is changed to positions of Z111, Z112, Z113 and Z114, respectively (again, as per FIG. 4). The impedance values after current passage through the highpass filter 102 and the low-pass filter 103 are Z114 and Z104, respectively, that is, are of different values from each other.

That is, except the case of the values of components for specified phase shift values, such as 180°, the impedance value after current passage through the high-pass filter differs from that after current passage through the low-pass filter, under the effect of reactance components, if any, in the impedances on the input/output sides of the filter. This difference in impedance needs to be ameliorated because it may give rise to signal insertion loss difference, variations in the phase shift value caused by a mismatch between the load impedance and the filter units, insertion loss at the time of switching between the filter units, and to worsened reflection losses.

Meanwhile, with the phase shifter disclosed in Patent Document 1, matching resistors are inserted on the input and output sides of the switch means to cancel out the reflection caused by impedance mismatch. This phase shifter has, however, a drawback that, since resistance matching circuits are provided forward and in rear of the switches, the number of circuits added is increased, and hence the component area occupied becomes broader, thus raising the chip cost. Moreover, since the resistance matching circuit includes an internal resistance connected in parallel with the signal transmitting channel, part of the signal is consumed in this matching resistor, thus raising insertion losses. In particular, since matching resistors are connected to the input and output sides of the switch means, the loss by the matching resistor is increased significantly when a plural number of the phase shifters are arranged in plural stages.

On the other hand, there is no explanation of the matching stub described in Patent publication 2, other than changing the impedance, while there lacks the description on the operation and result, and hence the contents of the matching stub are not clear.

Therefore there is much to be desired in the art for a phase shifter with a reduced insertion loss, in which the impedance mismatch after passage of the current through the high-pass filter or low-pass filter as well as the difference in insertion losses between the high-pass filter and the low-pass filter, or the phase shifting error, may be diminished.

According to the present invention, the following principle is proposed. That is, a circuit, composed of a capacitor and an inductor, such that will cancel out the reactance component of the impedance produced in a single pole double throw switch, to a single pole side of the switch, to change the impedance at the sites of insertion of filter units, to eliminate the impedance mismatch at a site downstream of the filter units in the signal flow direction.

In one aspect, the present invention provides a phase shifter for selectively switching between a low-pass filter and a high-pass filter by two single pole double throw switches provided on input and output sides and operatively linked to each other. The phase shifter comprises a first impedance adjustment circuit provided across an input terminal and a first one of the single pole double throw switches, and a second impedance adjustment circuit provided across an output terminal and a second one of the single pole double throw switches. Each of the first and second impedance adjustment circuits is made up by a capacitor and an inductor.

In a first modification of the above phase shifter, the first impedance adjustment circuit may be made up by a first capacitor connected across the input terminal and a single pole side junction of the first single pole double throw switch and a first inductor connected across the input terminal and the ground. The second impedance adjustment circuit may be made up by a second capacitor connected across the output terminal and a single pole side junction of the second single pole double throw switch and a second inductor connected across the output terminal and the ground.

In a second modification of the above phase shifter, the first single pole double throw switch and the second single pole double throw switch include a first switch device interconnecting the single pole side junction and the high-pass filter, a second switch device interconnecting a junction of the first switch device to the high-pass filter and the ground, a third switch device interconnecting the single pole side junction and the low-pass filter, and a fourth switch device interconnecting a junction of the third switch device to the low-pass filter and the ground. The second switch device and the third switch device are operatively linked to each other, the first switch device and the fourth switch device are operatively linked to each other, and the second and third switch devices on one hand and the first and fourth switch devices on the other hand perform an exclusively ON operation.

In a third modification of the above phase shifter, the first single pole double throw switch and the second single pole double throw switch include a first switch device interconnecting the single pole side junction and the high-pass filter, a third inductor connected parallel to the first switch device, a second switch device interconnecting the single pole side junction and the low-pass filter, and a fourth inductor connected parallel to the second switch device, and the first and second switch devices perform an exclusively ON operation.

In a fourth modification of the above phase shifter, the switch devices are each made up by a field effect transistor.

In a fifth modification of the above phase shifter, the capacitance of the first capacitor and the inductance of the first inductor are set so that the impedance looking from a junction of the first single pole double throw switch to the high-pass filter up to the input side when the first single pole double throw switch is connected to the high-pass filter approaches to the impedance looking from the junction point up to the high-pass filter and so that the impedance looking from a junction of the first single pole double throw switch to the low-pass filter up to the input side when the first single pole double throw switch is connected to the low-pass filter approaches to the impedance looking from the junction point up to the low-pass filter, while the capacitance of the second capacitor and the inductance of the second inductor are set so that the impedance looking from a junction of the second single pole double throw switch to the high-pass filter up to the output side when the second single pole double throw switch is connected to the high-pass filter approaches to the impedance looking from the junction point up to the high-pass filter and so that the impedance looking from a junction of the second single pole double throw switch to the low-pass filter up to the output side when the second single pole double throw switch is connected to the low-pass filter approaches to the impedance looking from the junction point up to the low-pass filter.

In a sixth modification of the above phase shifter, the first impedance adjustment circuit is configured for diminishing an absolute value of a reactance component when looking from a junction of the first single pole double throw switch to the highpass filter up to the input side when the first single pole double throw switch is connected to the high-pass filter and an absolute value of a reactance component when looking from a junction of the first single pole double throw switch to the low-pass filter up to the input side when the first single pole double throw switch is connected to the low-pass filter, while the second impedance adjustment circuit is configured for diminishing an absolute value of a reactance component when looking from a junction of the second single pole double throw switch to the high-pass filter up to the output side when the second single pole double throw switch is connected to the high-pass filter and an absolute value of a reactance component when looking from a junction of the second single pole double throw switch to the low-pass filter up to the output side when the second single pole double throw switch is connected to the low-pass filter.

In a seventh modification of the above phase shifter, the capacitance of the first capacitor and the inductance of the first inductor are set for diminishing an absolute value of a reactance component when looking from a junction of the first single pole double throw switch to the high-pass filter up to the input side when the first single pole double throw switch is connected to the high-pass filter and an absolute value of a reactance component when looking from a junction of the first single pole double throw switch to the low-pass filter up to the input side when the first single pole double throw switch is connected to the low-pass filter, while the capacitance of the second capacitor and the inductance of the second inductor are set for diminishing an absolute value of a reactance component when looking from a junction of the second single pole double throw switch to the high-pass filter up to the output side when the second single pole double throw switch is connected to the high-pass filter and an absolute value of a reactance component when looking from a junction of the second single pole double throw switch to the low-pass filter up to the output side when the second single pole double throw switch is connected to the low-pass filter.

The meritorious effects of the present invention are summarized as follows.

According to the present invention, the effect of the insertion loss of the phase shifter against load variations outside the phase shifter may be equated on the high-pass filter side and on the low-pass filter side, and hence the phase shifting error and the amplitude error may be suppressed to low values. Since the impedance adjustment circuits are each made up by a capacitor and an inductor, the insertion losses may be reduced. Moreover, there is no necessity of matching the impedance of the filter units to the characteristic impedance of the signal lines and the impedance values of the filter units may be determined in consideration of the structures of the respective devices to diminish the effect of manufacture tolerances thereof.

PREFERRED EMBODIMENTS OF THE INVENTION

Figure 1:
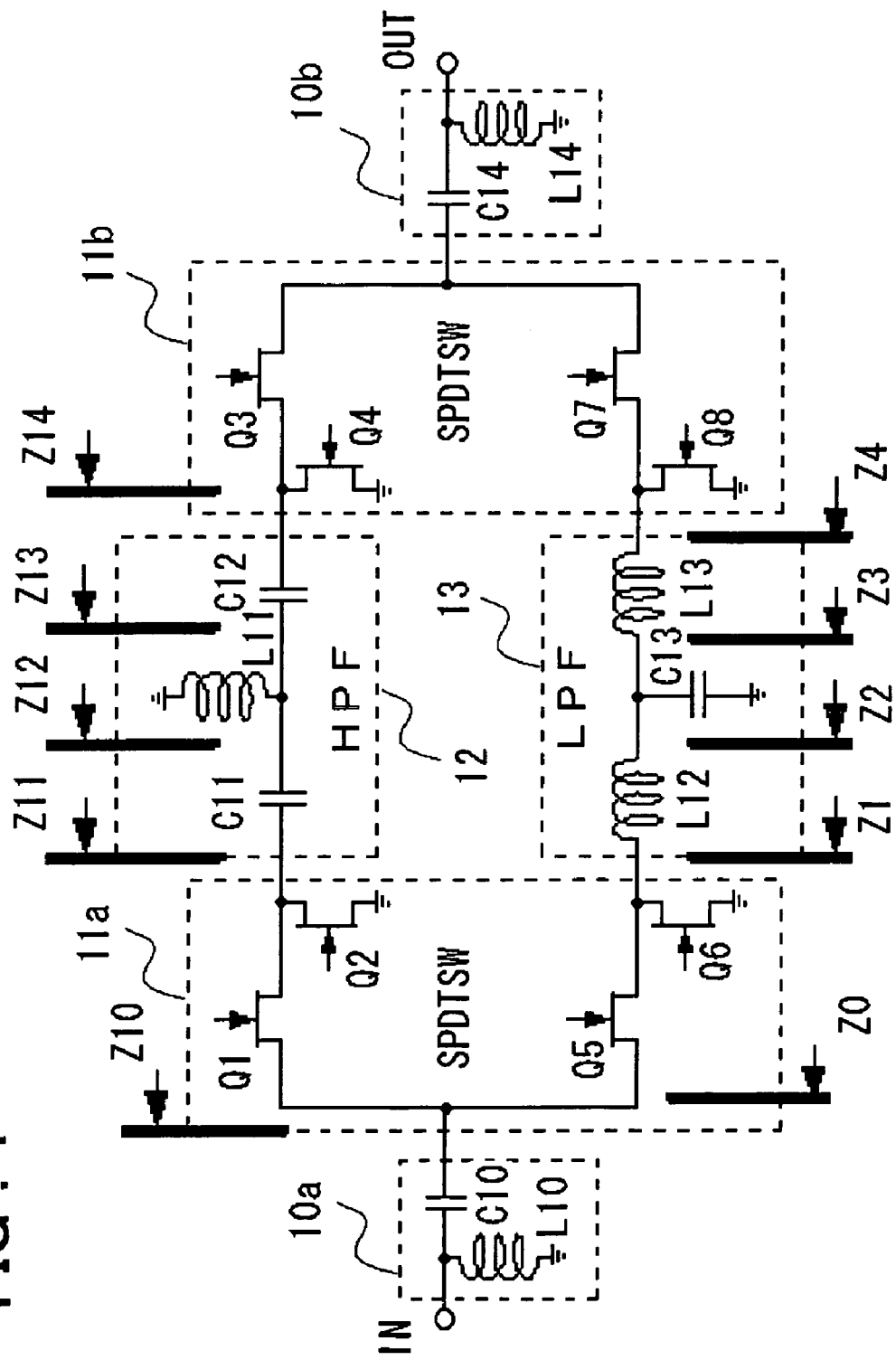
FIG. 1 is a circuit diagram showing the configuration of a phase shifter according to a first embodiment of the present invention.

A phase shifter of a preferred embodiment of the present invention switches between a low-pass filter (LPF, 13 of FIG. 1) and a high-pass filter (HPF, 12 of FIG. 1) by two single pole double throw switches (SPDTSW, 11a and 11b of FIG. 1), provided on the input and output sides and which are operatively linked to each other. An impedance adjustment circuit (10a of FIG. 1), connected across an input terminal (IN of FIG. 1) and a single pole double throw switch (11a of FIG. 1), includes a capacitor (C10 of FIG. 1) connected across the input terminal (IN of FIG. 1) and a single pole side junction of the single pole double throw switch (11a of FIG. 1), and an inductor (L10 of FIG. 1) connected across the input terminal and the ground. An impedance adjustment circuit (10b of FIG. 1), connected across an output terminal (OUT of FIG. 1) and a single pole double throw switch 11b of FIG. 1), includes a capacitor (C14 of FIG. 1) connected across the output terminal (OUT of FIG. 1) and a single pole side junction of the single pole double throw switch (11b of FIG. 1), and an inductor (L14 of FIG. 1) connected across the output terminal and the ground.

In the above-described phase shifter, one of the low-pass filter (13 of FIG. 1) and the high-pass filter (12 of FIG. 1) is selected by the two single pole double throw switches (11a and 11b of FIG. 11) operatively linked to each other. Signal flow occurs from the input terminal (IN of FIG. 1) through the impedance adjustment circuit (10a of FIG. 1), lowpass filter (13 of FIG. 1) or the high-pass filter (12 of FIG. 1) as selected, and through the impedance adjustment circuit (10b of FIG. 1), to the output terminal (OUT of FIG. 1). At this time, reactance components in the impedance (Z1 of FIG. 1), when looking from the junction between the single pole double throw switch (11a of FIG. 1) and the low-pass filter (13 of FIG. 1), in case of selection by the single pole double throw switch (11a of FIG. 1) of the lowpass filter (13 of FIG. 1), up to the input side, and in the impedance (Z11 of FIG. 1), when looking from the junction between the single pole double throw switch (11a of FIG. 11) and the high-pass filter (12 of FIG. 1), in case of selection by the single pole double throw switch (11a of FIG. 1) of the high-pass filter (12 of FIG. 1), up to the input side, may be rendered approximately zero by the impedance adjustment circuit (10a of FIG. 1). In a similar manner, reactance components in the impedance when looking from the junction between the single pole double throw switch (11b of FIG. 11) and the low-pass filter (13 of FIG. 1) up to the input side, and in the impedance (Z11 of FIG. 1), when looking from the junction between the single pole double throw switch (11b of FIG. 11) and the highpass filter (12 of FIG. 1) up to the output side, may be rendered approximately zero by the impedance adjustment circuit (10b of FIG. 1).

Thus, impedance mismatch after passage of the current through the high-pass filter (12 of FIG. 1) and the low-pass filter (13 of FIG. 1) is diminished, such that it becomes possible to suppress the phase shifting error or the loss of insertion of components between that to the high-pass filter (12 of FIG. 1) and that to the low-pass filter (13 of FIG. 1) On the other hand, since the impedance adjustment circuits (10a, 10b of FIG. 1) are each made up of a capacitor and an inductor, component insertion losses are low.

[First Embodiment]

FIG. 1 is a circuit diagram showing the configuration of a phase shifter according to a first embodiment of the present invention. In FIG. 1, the phase shifter includes impedance adjustment circuits 10a, 10b, single pole double throw switches 11a, 11b, a high-pass filter 12 and a low-pass filter 13.

The impedance adjustment circuit 10a is made up by an inductor L10, connected across an input terminal IN and the ground, and a capacitor C10, connected across the input terminal IN and the single pole double throw switch 11a. Similarly, the impedance adjustment circuit 10b is made up by an inductor L14, connected across an output terminal OUT and the ground, and a capacitor C14, connected across the output terminal OUT and the single pole double throw switch 11b.

The single pole double throw switch ha is made up by a FET Q1, connected across a single pole side, connected to the impedance adjustment circuit 10a, and the high-pass filter 12, a VET Q2, connected across a junction between the high-pass filter 12 and the FET Q1 and the ground, a FET Q5, connected across the single pole and the low-pass filter 13, and a VET Q6, connected across a junction between the low-pass filter 13 and the FET Q5 and the ground. In a similar manner, the single pole double throw switch lib is made up by a FET Q3, connected across a single pole side, connected to the impedance adjustment circuit 10b, and the high-pass filter 12, a FET Q4, connected across a junction between the high-pass filter 12 and the FET Q3 and the ground, a VET Q7, connected across the single pole and the low-pass filter 13, and a FET Q8, connected across a junction between the low-pass filter 13 and the FET Q7 and the ground.

The high-pass filter 12 is made up by capacitors C11, C12, connected in series across the single pole double throw switches 11a and 11b, and an inductor L11, connected across a junction point of the capacitors C11, C12 and the ground. The low-pass filter 13 is made up by inductors L12, L13, connected in series across the single pole double throw switches 11a and 11b, and a capacitor C13, connected across a junction point of the inductors L12, L13 and the ground.

The phase shifter, constructed as described above, is similar to the state-of-the-art phase shifter in structure and in operation, insofar as the single pole double throw switches 11a and 11b, high-pass filter 12 and the low-pass filter 13 are concerned. However, the phase shifter, described above, differs from the state-of-the-art phase shifter in having the impedance adjustment circuits 10a, 10b, as supplementary circuits, on the input and output sides, respectively. The impedance adjustment circuits 10a, 10b have the function of lowering reactance components of the impedance, produced during current passage through the switch units, to an extremely small value (that is, of allowing only resistance components to persist as the impedance).

In the present embodiment, this impedance adjustment circuit 10a (10b) includes a capacitor, provided on an electrical path from the single pole double throw switch 11a (11b) in series with the input terminal IN (output terminal OUT), while including an inductor on a parallel electrical path from the input terminal IN (output terminal OUT). The impedance adjustment circuit is set so that, after current passage through the switch, that is, at points Z1, Z11 of FIG. 1, the absolute value of the reactance components will be of minimum values. Since the impedance at back of the single pole double throw switch 11a (11b) may be changed in dependence upon the structure of the single pole double throw switch 11a (11b), the circuit structure of the impedance adjustment circuit 10a (10b) needs to be such as may deal with changes in the impedance.

Figure 2B:
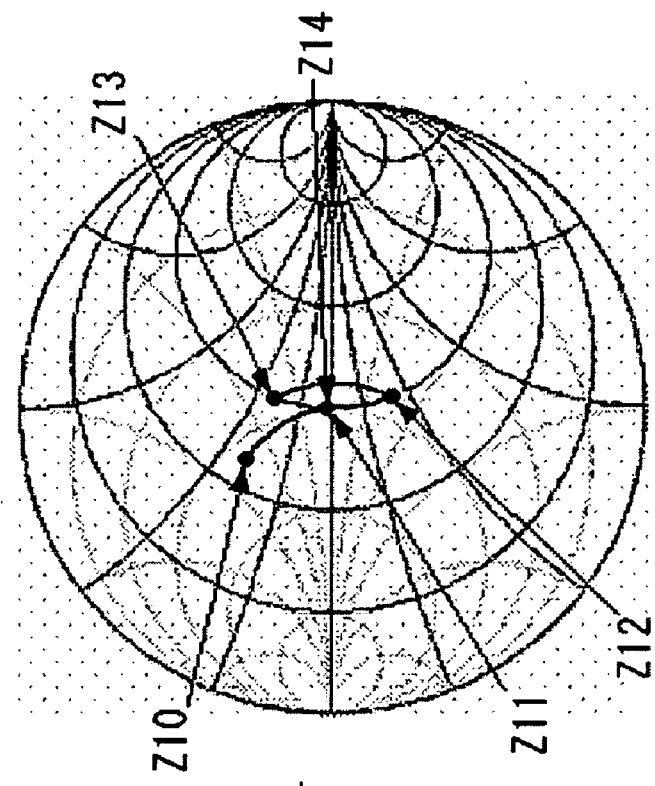
FIGS. 2A and 2B are Smith charts showing the impedance of various parts in the phase shifter according to the first embodiment of the present invention.
Figure 2A:
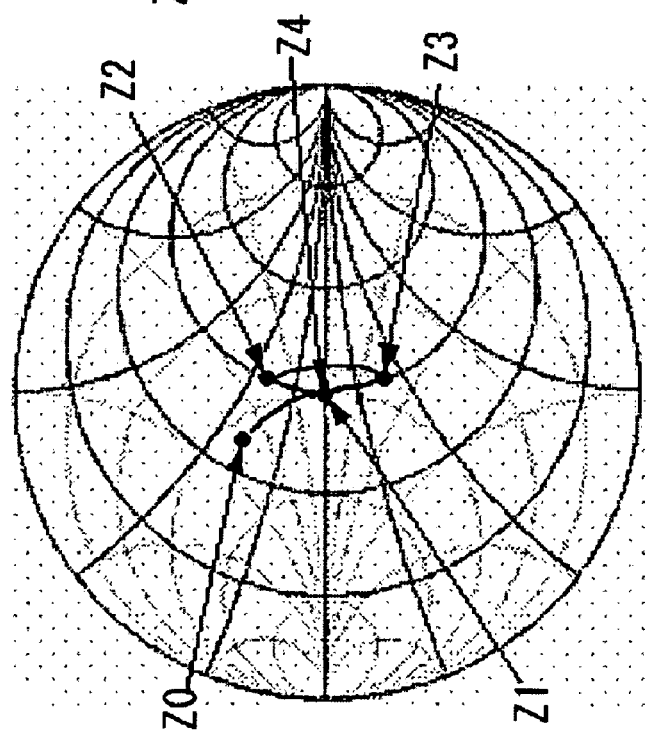

The changes in the impedance at back of the components of the respective filter units of the phase shifter will now be explained. FIGS. 2A and 2B depict a Smith chart showing impedance values of respective points of the phase shifter according to the first embodiment of the present invention. It is noted that values of the components of the capacitors C11, C12 and the inductor L11 of the high-pass filter 12 are set so that the high-pass filter will have a phase lead of 45°, while values of the components of the inductors L12, L13 and the capacitor C13 of the low-pass filter 13 are set so that the low-pass filter will have a phase lag of 45°. In addition, the values of the components of the high-pass and low-pass filter units are set so that the value of the reactance of the high-pass filter 12 will be equal to those of the low-pass filter 13.

With reference to FIG. 2A, when the low-pass filter 13 is turned on by the single pole double throw switch 11a (11b), the impedance values when looking from points at back of the respective components up to the input side are changed to positions Z0, Z1, Z2, Z3 and Z4 (corresponding circuit locations being shown in FIG. 1), at points at back of the impedance adjustment circuit 10a, at back of the single pole double throw switch 10a, at back of the first inductor L12 of the low-pass filter 13, at back of the next parallel connected capacitor C13 and at back of the second inductor L13, respectively.

With reference to FIG. 2B, when the high-pass filter 12 is turned on by the single pole double throw switch 11a (11b), the impedance values looking from points at back of the respective components up to the input side are changed to positions Z10, Z11, Z12, Z13 and Z14 (corresponding circuit locations being shown in, at points at back of the impedance adjustment circuit 10a, at back of the single pole double throw switch 11a, at back of the first capacitor C11 of the high-pass filter 12, at back of the next parallel connected inductor L11 and at back of the second capacitor C12, respectively.

What is noteworthy in this case are the positions Z1 and Z11 of the impedance at the back of the single pole double throw switch 11a. By providing the impedance adjustment circuit 10a, the reactance components of the impedances at the points Z1 and Z11 are approximately zero, with the impedance being composed only of resistance components. In this case, the impedance values forward and at back of the filter units (Z1 and Z4; Z11 and Z14) may be restored to the same values, as may be seen from the Smith chart of FIGS. 2A and 2B.

In case reactance components are included the impedance at back of the switches along the current flow direction, it becomes difficult to adjust the values of the filter components. The reason is that, if simply the values of the components are adjusted as the balance of characteristics of the insertion loss and the amounts of phase shift is maintained, the impedance balance between the high-pass filter and the low-pass filter is worsened. For maintaining the balance of characteristics of the insertion loss and the amounts of phase shift, the reactance components of the filter components of the high-pass filter 12 are desirably set so as to be of the same values as those of the low-pass filter 13. For setting the values of the impedance at back of the filter units to the same value, it is necessary that the impedance at back of the single pole double throw switch 11a along the signal flow direction be made up only of resistance components, in other words, the reactance component in the impedance be of an extremely small value.

With the high-pass filter 12, the impedance on the Smith chart is moved to the capacitive area, that is, from Z11 to Z12 in FIG. 2B, by the series connected capacitor C11, whereas, with the low-pass filter 13, the impedance on the Smith chart moves towards the inductive area by the series connected inductor L12, that is, from Z1 to Z2 in FIG. 2A, in a direction of the opposite reactance component. For canceling the reactance component in the reverse direction, the inductor L11 and the capacitor C12 are in operation, in the case of the high-pass filter 12, for return to the original impedance (from Z12 in FIG. 2B to Z13 and thence to Z14). In the case of the low-pass filter 13, the capacitor C13 and the inductor L13 are in operation for return to the original impedance (from 22 in FIG. 2A to Z3 and thence to Z4).

In case the impedance of the sides of the single pole double throw switch, connected to the filter units, includes reactance components, the point the impedance is moved to, in case of traversing the high-pass filter, differs from the point the impedance is moved to, in case of traversing the low-pass filter.

The values of the respective components of the filter units may be determined so that desired phase shift values will be obtained in consideration of reactance components generated at the switch units. In this case, however, the balance of the reactance differs significantly between the high-pass filter 12 and the low-pass filter 13 such that the passage loss of one of the filter units becomes larger than that of the other, with the amplitude error by the switch changeover operation increasing to deteriorate phase shifter characteristics.

In the present embodiment, in which the impedance adjustment circuit 10a is provided for eliminating reactance components in the rear of the single pole double throw switch 11a along the signal flow direction, the impedance value in rear of the filter units along the signal flow direction becomes equal, and hence the deterioration of characteristics, such as that described above, is not liable to be produced.

In FIG. 1, the impedance adjustment circuit 10a, canceling the reactance components of the impedance, generated in the single pole double throw switch 11a, and usually the impedance at the filter coupling area is matched to the characteristic impedance, for example, 50 ohms. It is however possible to set the impedance to different values by changing the values of the components of the impedance adjustment circuit 10a. In this case, the values of the phase shifter components may be changed in keeping with the impedance values.

For example, if, during operation at 12 GHz, the impedance of the filter unit of the phase shifter is set to 50 ohms, the values of the inductors L12, L13 and the capacitor C13 in the low-pass filter 13, are 0.282 nH, 0.282 nH and 0.192 pF, while those of the inductor L11 and the capacitors C11, C12 in the high-pass filter 12 are 0.962 nH, 0.657 pF and 0.657 pF, respectively.

In addition, if the impedance is 75 ohms, the above values of the inductors L12, L13, capacitor C13, inductor L11, and capacitors C11, C12 are 0.423 nH, 0.423 nH, 0.128 pF, 1.443 nH, 0.438 pF and 0.438 pF, respectively. If the impedance is 25 ohms, the above values of these respective components are 0.141 nH, 0.141 nH, 0.385 pF, 0.481 nH, 1.314 pF and 1.314 pF, respectively. That is, if the impedance value is 25 ohms, the values of the inductors and the capacitors are ½ times and twice those in case of the impedance value of 50 ohms, respectively. If the impedance value is 75 ohms, the values of the inductors and the capacitors are 1.5 times and ⅔ times those in case of the impedance value of 50 ohms, respectively.

In case of the operation at a high frequency, it is necessary to diminish the values of the components making up the filter units. In this case, the capacitors are more susceptible to fringing capacitance (capacitance generated at the capacitor fringes) or to manufacture tolerances, thus significantly influencing the variations in the values of the capacitors. Thus, by setting the values of the components of the impedance adjustment circuit 10a (10b) for diminishing the impedance in the filter units, the capacitor area may be increased to diminish the manufacture tolerances.

That is, the impedance adjustment circuit 10a (10b), which will cancel reactance components of the impedance in the single pole double throw switch 11a (11b), may be provided in such a manner that the impedance of an area connecting to the filter unit will be equal to the characteristic impedance outside the phase shifter. On the other hand, the impedance of the filter unit can be set unequal to the characteristic impedance. By changing the impedance of the filter unit, the values of the components, making up the filter unit, may be changed, so that the size of the structure of the components may be changed to a size less susceptible to manufacture tolerances.

[Second Embodiment]

Figure 3:
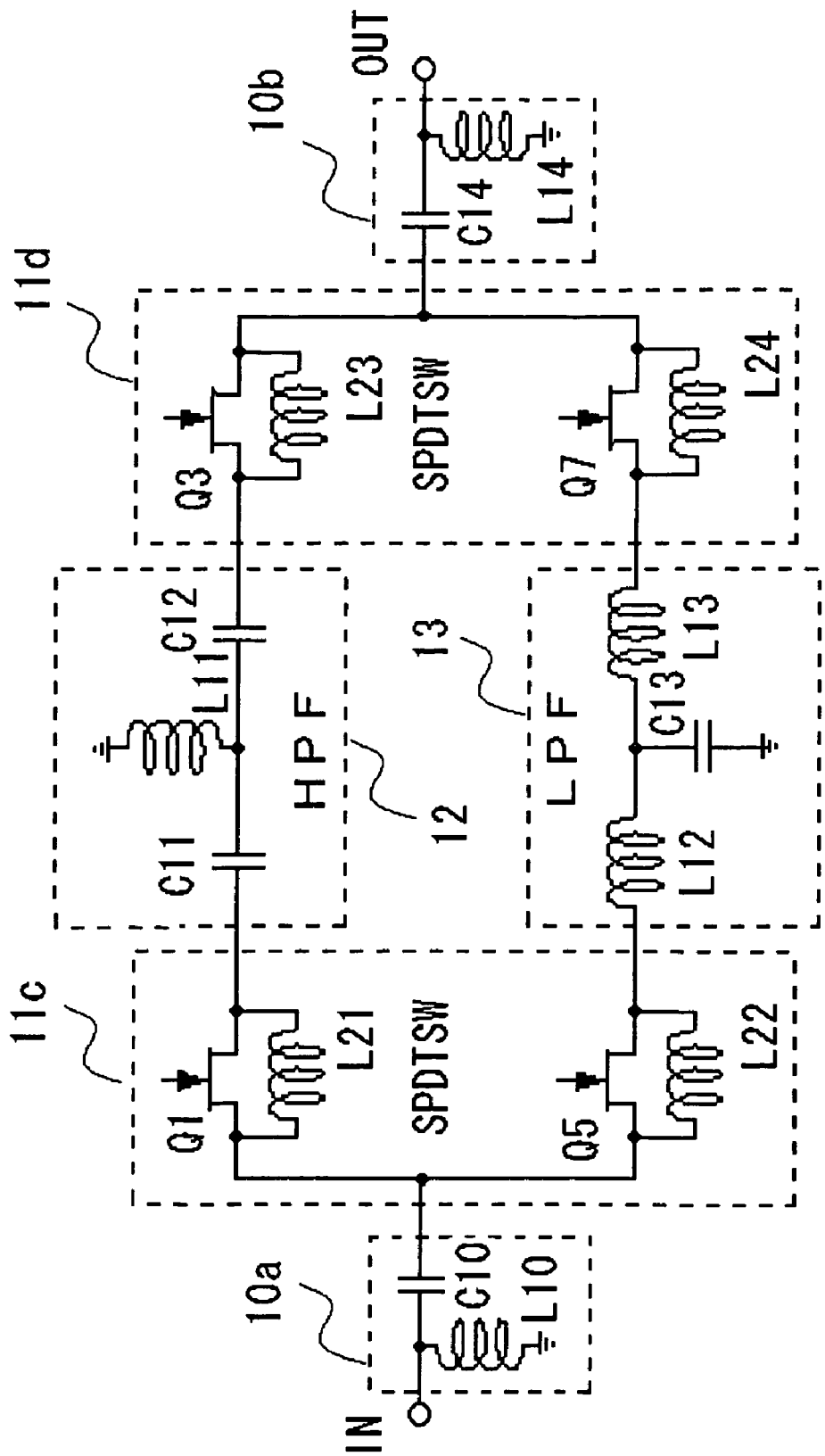
FIG. 3 is a circuit diagram showing the configuration of a phase shifter according to a second embodiment of the present invention.
Figure 4:
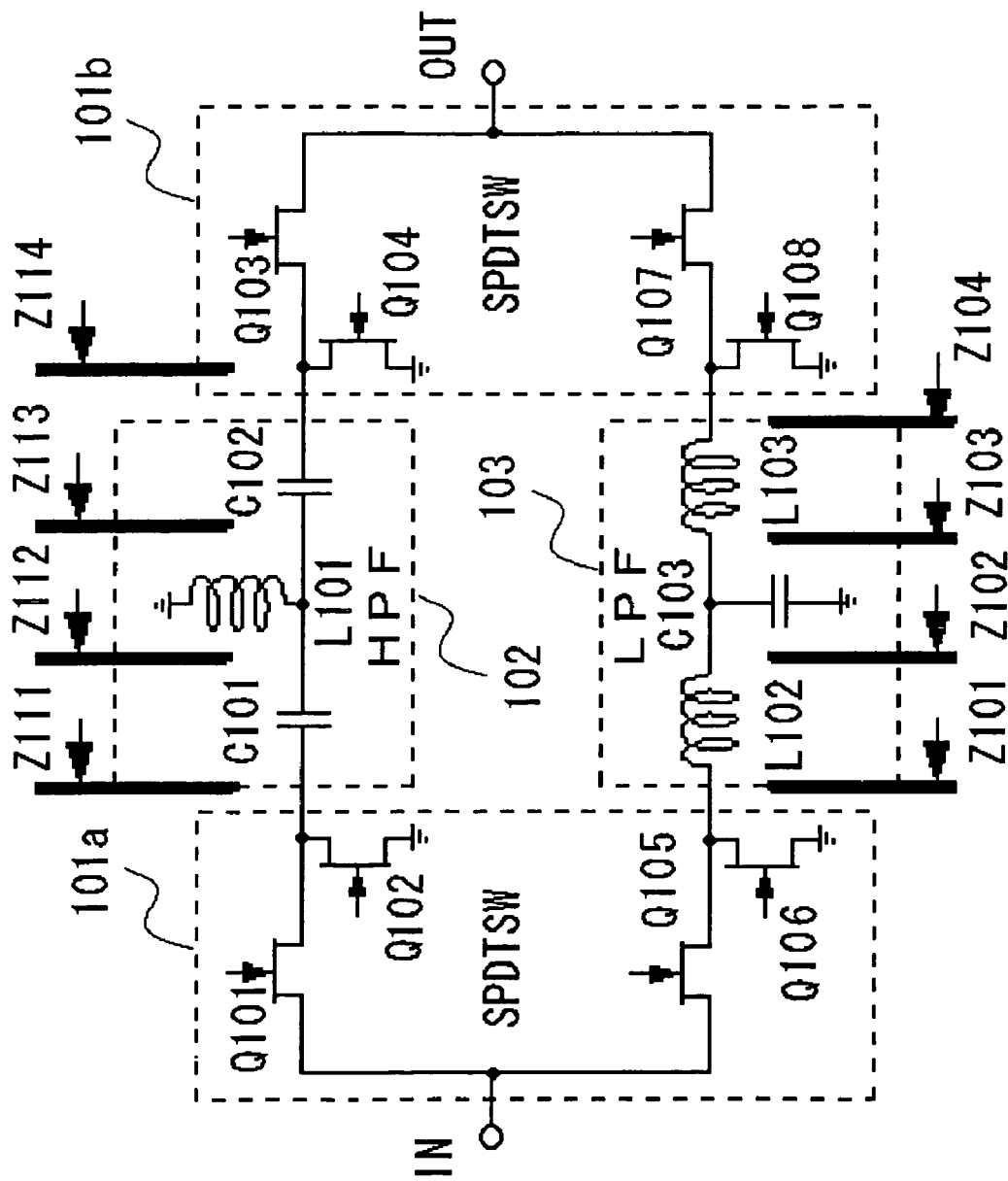
FIG. 4 is a circuit diagram showing the structure of a conventional phase shifter.
Figure 5B:
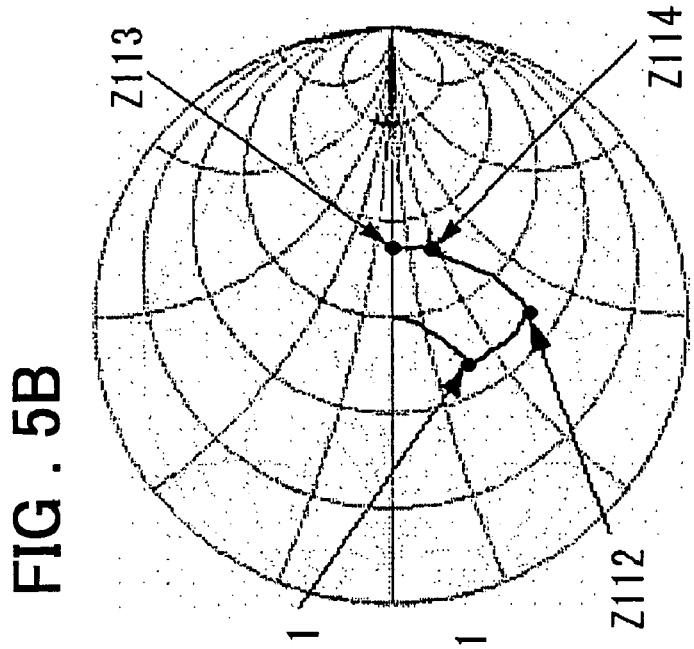
FIGS. 5A and 5B are Smith charts showing the impedance of various parts in the conventional phase shifter, analyzed by the present inventor.
Figure 5A:
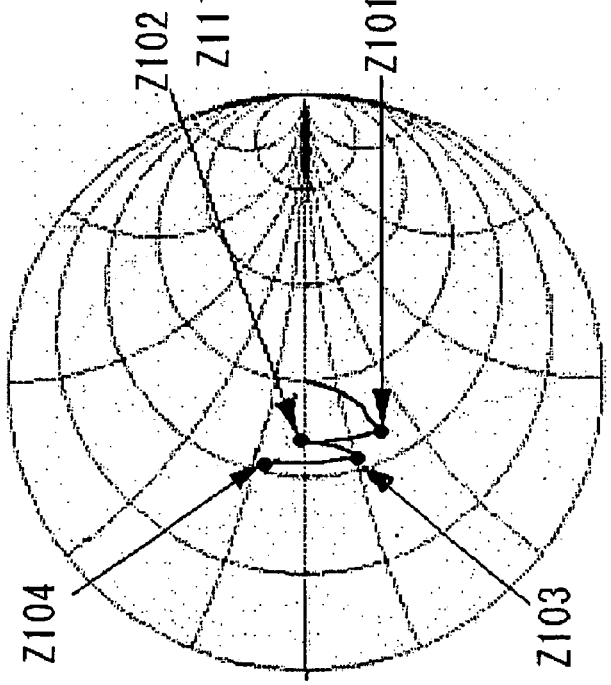

FIG. 3 depicts a circuit diagram showing the structure of a phase shifter according to a second embodiment of the present invention. In FIG. 3, the same reference numerals and labels are used to depict the same components. What makes FIG. 3 significantly different from FIG. 1 is that inductors L21, L23, L22 and L24 are connected across the sources and the drains of the FETs Q1, Q3, Q5 and Q7 in the single pole double throw switches 11c, 11d, respectively. Such parallel connection of the FET and the inductor forms a switch exploiting the resonance between the inductor and the parasitic capacitance of the FET. That is, in the present second embodiment, a resonance switch composed of an inductor and an FET, to the source and drain of which the inductor is connected in parallel, is substituted for each of the single pole double throw switches 11c, 11d.

The operation of the phase shifter, shown in FIG. 3, is that, when signals are passed through the high-pass filter 12, the FETs Q1, Q3 are turned on, the FETs Q5, Q7 are turned off. Since parasitic capacitance is produced across the sources and the drains of the FETs Q5, Q7, turned off, and resonance is produced in the band of the phase shifter across the parasitic capacitance and the inductor, connected parallel to the FET, thus obstructing the signal passage. Conversely, the resistance across the sources and the drains of the FETs Q1, Q3, turned on, is lowered, and hence the signals are allowed to pass through the high-pass filter 12.

If, on the other hand, signals are passed through the low-pass filter 13, the FETs Q1, Q3 are turned off, while the FETs Q5, Q7 are turned on, to allow the passage of the signals through the low-pass filter 13, as in the case of allowing the passage of the signals through the high-pass filter 12. Meanwhile, the values of the components in the high-pass filter 12 and in the low-pass filter 13 are equivalent to those explained in connection with the first embodiment.

In the second embodiment, the single pole double throw switch is formed by a resonance switch. If, in this embodiment, one of the FETs Q1, Q5, Q3, Q7 is turned on, the high frequency operation tends to be affected by the inductors L21, L22, L23 and L24, respectively, connected parallel to the FETs, and hence the risk is high that characteristics may be deteriorated by e.g. signal reflection or band variations caused by impedance variations at back of the switch units along the signal flow direction. With the impedance adjustment circuits 10a, 10b, provided on the single pole side of the single pole double throw switch, it is possible to cancel the effect of the inductors L21, L22, L23 and L24 to prevent the impedance from being varied to suppress generation of signal reflection etc.

The single pole double throw switches 11c, 11d are meritorious in that the number of FETs to be controlled is one-half that in the case of FIG. 1 and in that the switches may be simpler in structure. However, during the on-time, the inductors, connected parallel to the FETs, tend to affect the characteristics. The supplementary circuits 10a, 10b operate to reduce the effect of the inductors to an extremely small value and act efficaciously for a phase shifter employing resonant type switch.

Although the foregoing explanation has mainly been made for the input terminal side, the explanation may similarly apply for the output terminal side, because the phase shifter is of left-right symmetrical configuration. The phase shifter according to the present invention can be widely employed by integrated circuits, including large scale integrated circuits, in general for variety of uses.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A phase shifter for selectively switching between a low-pass filter and a high-pass filter by first and second single pole double throw switches provided on input and output sides and operatively linked to each other, comprising:
   a first impedance adjustment circuit provided across an input terminal and said first single pole double throw switch; and
   a second impedance adjustment circuit provided across an output terminal and said second single pole double throw switch;
   each of said first and second impedance adjustment circuits being made up by a capacitor and an inductor,
   said first impedance adjustment circuit being comprised of a first capacitor connected across said input terminal and a single pole side junction of said first single pole double throw switch and a first inductor connected across said input terminal and the ground; and
   said second impedance adjustment circuit being comprised of a second capacitor connected across said output terminal and a single pole side junction of said second single pole double throw switch and a second inductor connected across said output terminal and the ground.

2. An integrated circuit comprising the phase shifter as defined in claim 1.

3. The phase shifter as defined in claim 1, wherein said first single pole double throw switch and said second single pole double throw switch each comprises:
   a first switch device interconnecting said single pole side junction and said high-pass filter;
   a second switch device interconnecting a junction of said first switch device to said high-pass filter and the ground;
   a third switch device interconnecting said single pole side junction and said low-pass filter; and
   a fourth switch device interconnecting a junction of said third switch device to said low-pass filter and the ground;
   said second switch device and said third switch device being operatively linked to each other, said first switch device and said fourth switch device being operatively linked to each other.

4. An integrated circuit comprising the phase shifter as defined in claim 3.

5. The phase shifter as defined in claim 3, wherein said first through fourth switch devices each comprises a field effect transistor.

6. An integrated circuit comprising the phase shifter as defined in claim 5.

7. The phase shifter as defined in claim 1, wherein
   the capacitance of said first capacitor and the inductance of said first inductor are set so that an impedance looking from a first junction of said first single pole double throw switch to said high-pass filter to the input side when said first single pole double throw switch is connected to said high-pass filter approaches an impedance looking from said first junction to said high-pass filter, and so that an impedance looking from a second junction of said first single pole double throw switch to said low-pass filter to the input side when said first single pole double throw switch is connected to said low-pass filter approaches an impedance looking from said second junction to said low-pass filter; and
   the capacitance of said second capacitor and the inductance of said second inductor are set so that an impedance looking from a third junction of said second single pole double throw switch to said high-pass filter to the output side when said second single pole double throw switch is connected to said high-pass filter approaches an impedance looking from said third junction to said high-pass filter, and so that an impedance looking from a fourth junction of said second single pole double throw switch to said low-pass filter up to the output side when said second single pole double throw switch is connected to said low-pass filter approaches an impedance looking from said fourth junction to said low-pass filter.

8. An integrated circuit comprising the phase shifter as defined in claim 7.

9. The phase shifter as defined in claim 1, wherein
   the capacitance of said first capacitor and the inductance of said first inductor are set for diminishing an absolute value of a reactance component when looking from a first junction of said first single pole double throw switch to said high-pass filter to the input side when said first single pole double throw switch is connected to said high-pass filter, an absolute value of a reactance component when looking from a second junction of said first single pole double throw switch to said low-pass filter to the input side when said first single pole double throw switch is connected to said low-pass filter; and the capacitance of said second capacitor and the inductance of said second inductor are set for diminishing an absolute value of a reactance component when looking from a third junction of said second single pole double throw switch to said high-pass filter to the output side when said second single pole double throw switch is connected to said high-pass filter and an absolute value of a reactance component when looking from a fourth junction of said second single pole double throw switch to said low-pass filter to the output side when said second single pole double throw switch is connected to said low-pass filter.

10. An integrated circuit comprising the phase shifter as defined in claim 9.

11. The phase shifter as defined in claim 1, wherein said first single pole double throw switch and said second single pole double throw switch each comprises:
   a first switch device interconnecting said single pole side junction and said highpass filter;
   a third inductor connected parallel to said first switch device;
   a second switch device interconnecting said single pole side junction and said lowpass filter; and
   a fourth inductor connected parallel to said second switch device.

12. An integrated circuit comprising the phase shifter as defined in claim 11.

13. The phase shifter as defined in claim 11, wherein said first and second switch devices each comprises a field effect transistor.

14. An integrated circuit comprising the phase shifter as defined in claim 13.

15. A phase shifter for selectively switching between a low-pass filter and a high-pass filter by first and second single pole double throw switches provided on input and output sides and operatively linked to each other, comprising:

a first impedance adjustment circuit provided across an input terminal and said first single pole double throw switch; and a second impedance adjustment circuit provided across an output terminal and said second single pole double throw switch;

each of said first and second impedance adjustment circuits being made up by a capacitor and an inductor, said first impedance adjustment circuit being configured for diminishing an absolute value of a reactance component when looking from a first junction of said first single pole double throw switch to said high-pass filter to the input side when said first single pole double throw switch is connected to said highpass filter and an absolute value of a reactance component when looking from a second junction of said first single pole double throw switch to said low-pass filter to the input side when said first single pole double throw switch is connected to said low-pass filter; and said second impedance adjustment circuit being configured for diminishing an absolute value of a reactance component when looking from a third junction of said second single pole double throw switch to said high-pass filter to the output side when said second single pole double throw switch is connected to said high-pass filter and an absolute value of a reactance component when looking from a fourth junction of said second single pole double throw switch to said low-pass filter to the output side when said second single pole double throw switch is connected to said low-pass filter.

16. An integrated circuit comprising the phase shifter as defined in claim 15.

* * * * *